United States Patent
Reinhardt (10) Patent No.: US 9,209,779 B2
(45) Date of Patent: Dec. 8, 2015

(54) HETEROGENOUS ACOUSTIC STRUCTURE FORMED FROM A HOMOGENEOUS MATERIAL

(75) Inventor: Alexandre Reinhardt, Ville (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 117 days.

(21) Appl. No.: 13/879,562

(22) PCT Filed: Oct. 6, 2011

(86) PCT No.: PCT/EP2011/067508
§ 371 (c)(1),
(2), (4) Date: Jun. 20, 2013

(87) PCT Pub. No.: WO2012/049073
PCT Pub. Date: Apr. 19, 2012

(65) Prior Publication Data
US 2014/0151151 A1  Jun. 5, 2014

(30) Foreign Application Priority Data
Oct. 15, 2010 (FR) ...................... 10 58402

(51) Int. Cl.
*H03H 9/02* (2006.01)
*H03H 3/02* (2006.01)
*H03H 3/08* (2006.01)

(52) U.S. Cl.
CPC ............ *H03H 9/02535* (2013.01); *H03H 3/02* (2013.01); *H03H 3/08* (2013.01); *H03H 9/02015* (2013.01); *H03H 9/02543* (2013.01); *H03H 9/02622* (2013.01); *Y10T 29/49016* (2015.01)

(58) Field of Classification Search
CPC .......... H03H 9/02622; H03H 9/02543; H03H 9/02015; H03H 9/02535
USPC ...... 310/313 R, 313 A, 313 B, 313 C, 313 D, 310/322, 326, 327
See application file for complete search history.

(56) References Cited

U.S. PATENT DOCUMENTS 3,963,997 A 6/1976 Hartemann
4,611,140 A * 9/1986 Whitlock et al. ......... 310/313 B
(Continued)

FOREIGN PATENT DOCUMENTS

JP S59-196600 A 11/1984
JP H03-049311 A 3/1991
(Continued)

OTHER PUBLICATIONS

Destefanis et al, "The formation of Waveguides and Modulators in LiNbO3 by Ion Implantation", J. Appl. Phys. 50(12), Dec. 1979, pp. 7898-7905.
(Continued)

*Primary Examiner* — Derek Rosenau
(74) *Attorney, Agent, or Firm* — Baker Hostetler LLP (57) ABSTRACT

An acoustic structure comprising comprises a layer of material having a first Young's modulus called the intrinsic modulus and a first density called the intrinsic density, characterized in that the layer comprises at least one first zone having said first Young's modulus and said first density and at least one second zone buried in the volume of said layer of material and having a second Young's modulus and/or a second density obtained by implanting and/or by diffusing atoms into the volume of said layer.

21 Claims, 10 Drawing Sheets

(56) References Cited

U.S. PATENT DOCUMENTS

| | | | |
|---|---|---|---|
| 6,534,900 B2* | 3/2003 | Aigner et al. | 310/326 |
| 2005/0140465 A1* | 6/2005 | Hwu | 333/187 |
| 2008/0303876 A1 | 12/2008 | Nihei | |

FOREIGN PATENT DOCUMENTS

| | | |
|---|---|---|
| JP | H04-120732 A | 4/1992 |
| JP | H06-303073 A | 10/1994 |
| JP | H08-162881 A | 6/1996 |
| JP | H08-190995 A | 7/1996 |
| JP | H08-307190 A | 11/1996 |
| JP | H10-084248 A | 3/1998 |
| JP | 2003-209457 A | 7/2003 |
| JP | 2005-110230 A | 4/2005 |
| JP | 2006-253190 A | 9/2006 |
| JP | 2009-290369 A | 12/2009 |
| WO | 2007/072409 A2 | 6/2007 |

OTHER PUBLICATIONS

Jackel et al, "Proton Exchange for High-Index Waveguides in LiNbO3", Appl. Phys. Lett. 41(7), Oct. 1982, pp. 607-608.

Pijolat et al, "Large Qxf Product for HBAR Using Smart Cut Transfer of LiNbO3 Thin Layers Onto LiNbO3 Substrate", IEEE International Ultrasonics Symposium Proceedings, 2008, pp. 201-204.

Ashwin K. Samarao, et al., "Temperature Compensation of Silicon Micromechanical Resonators via Degenerate Doping", 2009 IEEE International Electron Devices Meeting, Dec. 7, 2009, pp. 1-4, IEEE, Piscataway, NJ, USA, XP031644403.

Office Action in Japanese Patent Application No. 2013-533156, dated Sep. 15, 2015.

* cited by examiner

HETEROGENOUS ACOUSTIC STRUCTURE FORMED FROM A HOMOGENEOUS MATERIAL

CROSS-REFERENCE TO RELATED APPLICATIONS

This application is a National Stage of International patent application PCT/EP2011/067508, filed on Oct. 6, 2011, which claims priority to foreign French patent application No. FR 1058402, filed on Oct. 15, 2010, the disclosures of which are incorporated by reference in their entirety.

FIELD OF THE INVENTION

The field of the invention is that of acoustic devices (resonators and filters, but also optionally optoacoustic modulators) made from piezoelectric materials ($LiNbO_3$, $LiTaO_3$, etc.).

BACKGROUND

Single-crystal piezoelectric materials are widely used in industry, notably for producing surface acoustic wave (SAW) or bulk acoustic wave (BAW) components allowing resonators or filters to be synthesized. For these applications the most commonly used piezoelectric substrates are quartz, lithium niobate, lithium tantalate ($LiNbO_3$, $LiTaO_3$) or even langasite substrates. Among these materials lithium niobate and tantalate in addition exhibit relatively large variations in optical index as a function of mechanical stresses, thereby making them candidates of choice for the production of optoacoustic modulators for example.

Because of the bulk nature of the aforementioned substrates, the propagation medium of the acoustic waves can consist only of said substrate and one or more additional, optionally deposited, layers. This therefore only allows surface waves (waves naturally guided at the surface of the substrate), waves guided in a deposited layer, or a wave guided at the interface between the substrate and a deposited layer, to be exploited. In all these cases, the components produced use electrodes, in the form of interdigitated combs deposited on the surface of the substrate, to generate or receive acoustic waves, or even both simultaneously, as shown in FIGS. 1a and 1b, which illustrate a configuration in which the waves are created by interdigitated electrode combs $P_{Ei}$ produced directly on the surface of a piezoelectric substrate $S_{piezo}$ or at the interface between a layer $C_S$ and a piezoelectric substrate $S_{piezo}$, respectively.

Figure 1A:
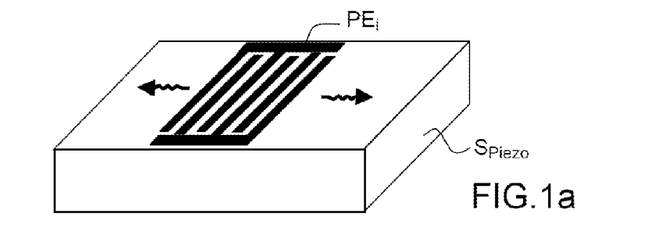
FIGS. 1a and 1b illustrate, respectively, a surface wave component exploiting, for the excitation or detection of waves, combs deposited directly on the surface, and combs covered by a layer deposited on the surface of the substrate.
Figure 1B:
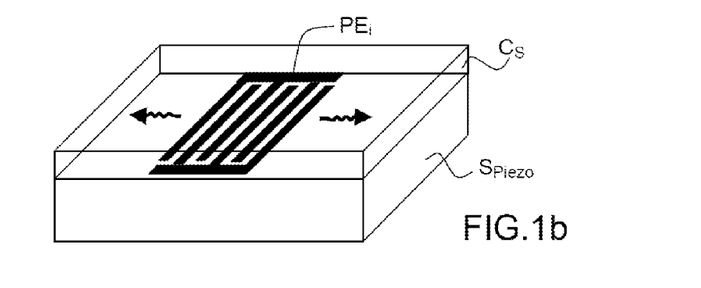

The advantage of surface wave components such as those shown in FIGS. 1a and 1b is that the surface waves are essentially localized in the substrate, thereby making it possible to take advantage of the properties of single-crystal materials: excellent reproducibility of the elastic, dielectric and piezoelectric properties compared to a deposited material; minimization of acoustic losses by virtue of the absence of inhomogeneities (grain boundaries, dislocations, etc.) in the material.

The drawback, in contrast, is that although it is possible to modify the crystal orientation, the propagation speed of the surface waves is set by the constituent material of the substrate, and generally remains relatively low (in the region of 4000 to 5000 m/s). For high-frequency applications (a few gigahertz), the dimensions of the features of the electrodes become extremely small, being related to the wavelength of the mode that it is desired to excite, and therefore become technologically difficult to control. The same problem is encountered in the case of interface waves.

One solution to this decrease in the dimensions of the interdigitated combs consists in using waves having a higher propagation speed than that of surface waves. This is the case of waves guided in a layer deposited on the surface of the substrate. Such waves can in theory reach virtually infinite propagation speeds. More reasonably, it is possible to exploit waves having phase speeds of about a few tens of kilometers per second, thereby already enabling, at equal frequency, constraints on the definition of the features of the electrodes to be considerably relaxed.

The major drawback in this case is that these waves are essentially localized in the added layer. This has two consequences: firstly, the wave propagates in a medium that no longer is single-crystal in nature, and therefore exhibits higher losses than a surface wave, even if perfect confinement of these waves is assumed. Secondly, the transduction (conversion of electrical energy into mechanical energy and vice versa) occurs in the piezoelectric material, even though most of the acoustic energy is localized in the deposited layer. Therefore, as a result the efficiency of this transduction is considerably reduced, thereby decreasing the performance of the final component (bandpass filters with narrower bands, resonators exhibiting less marked resonances, etc.).

Figure 2A:
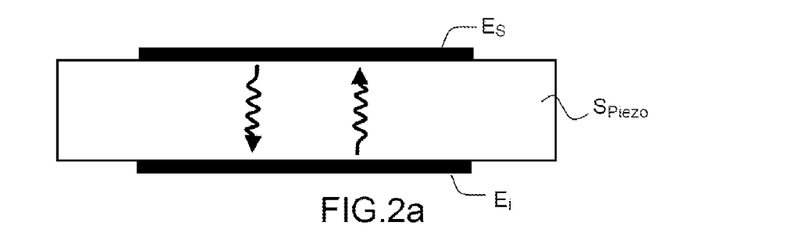
FIGS. 2a and 2b illustrate a bulk wave component using a bulk piezoelectric substrate and a thinned piezoelectric substrate, respectively.

It is also possible to exploit what are called bulk waves, which propagate in the thickness direction of the substrate. These waves are excited by electrodes—one electrode called the upper electrode $E_S$ and one electrode called the lower electrode Ei—surrounding the piezoelectric substrate $S_{piezo}$, as shown for example in FIG. 2a. The resonant frequency is in this case directly related to the thickness of the piezoelectric wafer. For low-frequency applications (a few megahertz), the substrate must typically be about 300 to 500 µm in thickness.

Figure 2B:
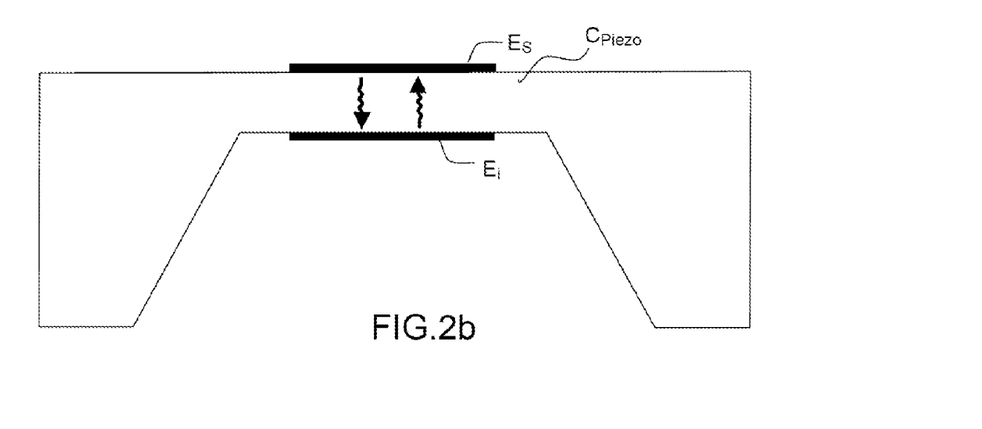

At higher frequencies, it becomes necessary to use smaller thicknesses, as small as a few hundreds of nanometers for applications at frequencies of about a gigahertz. This may be obtained by local etching of the substrate so as to form a membrane with the desired thickness as illustrated in FIG. 2b, which shows the substrate thinned to form a piezoelectric layer $C_{piezo}$, the waves being excited by an upper electrode Es and a lower electrode Ei. This technique is currently employed for quartz resonators, but it is difficult to apply to materials such as $LiTaO_3$ or $LiNbO_3$ because of their very high resistance to the various chemical or physical etching techniques available.

In addition, because of the precision with which the thicknesses must be obtained, approaches using local thinning have historically been abandoned. Currently it is preferred to employ thin piezoelectric film deposition techniques, which techniques provide much better uniformity and control of the thickness. Components produced in this way are called FBARs (film bulk acoustic resonators) when a suspended piezoelectric membrane is formed, or SMRs (solidly mounted resonators) when the acoustic confinement is obtained using a mirror composed of multiple stacked layers (analogous to optical Bragg mirrors). Even though these components have seen considerable growth in the last 10 years they still have a number of major drawbacks:

- piezoelectric-film deposition techniques do not allow the crystal orientation of the material to be easily chosen. In practice only a single orientation is therefore possible, thereby imposing precise characteristics (polarization, propagation speed, etc.) on the waves exploited;
- the properties of the piezoelectric materials conventionally employed for this type of component, namely aluminum nitride (AlN) or zinc oxide (ZnO), are greatly inferior to those of the materials employed in surface wave applications (LiNbO$_3$ or LiTaO$_3$), thereby preventing synthesis of very wideband filters, resonators with very high surtension coefficients, etc.

More recently, thin-film transfer techniques, such as for example combinations of bonding/thinning or even the SmartCut process concerning LiNbO$_3$, as described in the article M. Pijolat, A. Reinhardt, E. Defay, C. Deguet, D. Mercier, M. Aïd, J-S Moulet, B. Ghyselen, D. Gachon, S. Ballandras "Large Q.f product for HBAR using SmartCut transfer of LiNbO$_3$ thin layers onto LiNbO$_3$ substrate"—Proceedings of the 2008 IEEE Ultrasonics Symposium, p 201-204, have allowed thin single-crystal piezoelectric films (a few hundred nanometers in thickness) to be formed joined to other substrates, while preserving the intrinsic properties of the original material. Some of the aforementioned drawbacks can therefore be solved by these techniques. Nevertheless, the processes used impose technological constraints that at the present time remain insurmountable:

the "host" substrate (the substrate of the final component) and the "donor" substrate (that from which the added layer is produced) must be able to be bonded to one another. They must therefore both be flat. They must also have surfaces that are compatible with the bonding; and because of differences in the expansion coefficients of the added layer and the host substrate, it is not always possible to use any type of bonding, especially if it is desired not to use an elastic layer to absorb differential expansions. Thus, it is difficult to add layers of LiNbO$_3$ to a silicon substrate and it is preferable to add a layer of LiNbO$_3$ to a substrate made of the same material in order to overcome these effects. This constraint greatly reduces the number of possible stacks possible, and at the present time is slowing development of SMR devices using added layers.

SUMMARY OF THE INVENTION

In this context, the present invention provides a solution notably allowing problems related to the use of single-crystal layers, whether in SAW or BAW applications or even in applications employing added layers, to be solved and more generally provides a solution allowing acoustic structures to be produced the acoustic properties of which can be modified or even optimized by virtue of the introduction of species implanted in the volume of said structure, thereby modifying its Young's modulus and/or its density.

It is known that implantation of various atoms in a material results in modification of its optical properties, mainly the index of the medium. This principle has been widely applied and tested on a great variety of substrates as described in the article by G. Destefanis, J. P. Gaillard, E. L. Ligeon, S. Valette, B. W. Farmery, P. D. Townsend, A. Perez, *The formation of waveguides and modulators in LiNbO$_3$ by ion implantation*, J. Appl. Phys. 50 (12) p. 7898, 1979. More generally, implantation can have various effects depending on the space implanted, the material in which the implantation is carried out, the implantation energy, the implanted dose, and the various anneals applied, these effects possibly being:

the formation of electronic vacancies and/or defects in the original crystal, modifying the electronic properties and therefore the optical properties of the medium;

substitution of some of the atoms of the medium with implanted atoms. This results in the local formation of a new compound that is different from the original material, once again modifying the optical index; and precipitation of the implanted species, forming nanoscale inclusions. Depending on the species implanted, these inclusions may take the form of gas bubbles (implantation of hydrogen or helium, for example) or of solid inclusions (implantation of carbon or titanium, for example).

Although the first effect has a priori only a small or no influence on the mechanical properties of the medium, the two others, in contrast, modify the conditions of propagation of an acoustic wave.

Similarly, it is known that chemical reactions can lead to atoms in the crystal being substituted with atoms originating from an external source and penetrating into the piezoelectric medium by diffusion. The most common case is, for example, proton exchange where hydrogen atoms supplied by an acid bath are substituted for lithium atoms in lithium niobate (LiNbO$_3$) in order to form niobic acid (HNbO$_3$) or a compound such as HNbO$_3$. This case is for example described in the article J. L. Jackel, C. E. Rice, J. J. Veselka, *Proton exchange for high-index waveguides in LiNbO$_3$*, Applied Physics Letters Vol. 41, no. 7, p. 607, 1982. In this type of reaction an identical effect to the substitution discussed above takes place, thereby enabling local modification of the acoustic properties of the medium. The difference relative to substitution by implantation is that this type of process allows the original material to be modified only near the surface. However, as indicated in the aforementioned article, this modification may extend very deeply (about 10 microns) into the original medium, in contrast to implantation techniques where inclusions will certainly not be connected to the surface of the sample but will be localized at depths limited by the implantation energy, typically of about a few microns.

The principle behind the present invention, consisting in implanting species or forcing diffusion of species, is particularly pertinent for crystalline materials as it can be used to modify locally the mechanical properties of a medium, allowing novel acoustic component structures to be formed. More generally, it is equally advantageous when used with any type of material in order to modify the elastic behavior of the materials by modifying their elastic properties.

Alternatively, the formation of inclusions in the original material may also be exploited. Since these inclusions are much smaller than the acoustic wavelength at frequencies lower than a few tens of gigahertz (a few tens of nanometers relative to a few microns or a few hundred nanometers), they do not refract the waves but rather allow the latter to behave as if they are propagating in an equivalent medium the properties of which are between those of the original material and those of the inclusions.

Thus, one subject of the present invention is an acoustic structure comprising a layer of material having a first Young's modulus called the intrinsic modulus and a first density called the intrinsic density, characterized in that the layer comprises at least one first zone having said first Young's modulus and said first density and at least one second zone buried in the volume of said layer of material and having a second Young's modulus and/or a second density obtained by implanting and/or by diffusing atoms into the volume of said layer.

The second zone made of a second material thus formed in the original material, and which has lost some of its piezoelectric properties, thus does not make contact with the surface electrodes.

According to a variant of the invention, the second Young's modulus and/or the second density result from the creation of a new phase and/or inclusions in the second zone, by said implantation and/or diffusion.

According to a variant of the invention, the material is a piezoelectric material and said structure comprises electrodes on the surface of said layer, so as to generate acoustic waves.

It will be noted that in the first zone, the material is still piezoelectric but that it is not necessarily in the second zone after the implantation has been carried out.

According to a variant of the invention, the acoustic structure comprises a buried sublayer of inclusions and/or of a new phase so as to create a guide for elastic waves.

According to a variant of the invention, the acoustic structure comprises at least one first upper electrode and one second upper electrode, the second zone comprising periodic sublayers of inclusions and/or new phases defining a buried Bragg mirror structure, so as to define a bulk SMR-type wave resonator.

According to a variant of the invention, the second zone comprises periodic structures of inclusions and/or new phases so as to define a phononic crystal structure.

According to a variant of the invention, the acoustic structure furthermore comprises upper electrodes defining coupled resonator structures separated by a second zone of second Young's modulus and/or of second density so as to optimize the coupling between said resonators.

According to a variant of the invention, the acoustic structure furthermore also comprises third zones of third Young's modulus and/or of third density comprising inclusions and/or a new phase on the periphery of the two coupled resonators so as to decrease propagation of the lateral acoustic waves in the piezoelectric material in said third zones more greatly than in said second zones, the density of inclusions and/or their nature and/or the phase in the third zones being different to those of the second zones.

According to a variant of the invention, the material is lithium niobate $LiNbO_3$, the second zone comprises a new phase formed by implanting and/or diffusing hydrogen atoms, the second zone comprising a material of the type $H_xLi_{(1-x)}NbO_3$ having said second Young's modulus.

Another subject of the invention is a process for manufacturing an acoustic structure according to the invention, noteworthy in that it comprises the following steps:
producing a mask so as to isolate said second zone from said first zone; and
implanting and/or diffusing atoms so as to define said second zone through the mask by creating a new phase and/or inclusions.

According to a variant of the invention, the process furthermore comprises at least one step of producing electrodes, said structure being an acoustic wave resonator.

According to a variant of the invention, the process comprises an annealing step after the step of implanting and/or diffusing atoms.

According to a variant of the invention, the process comprises successive operations of implanting and/or diffusing atoms at similar energies so as to create a second continuous implantation and/or diffusion zone.

According to a variant of the invention, the process comprises successive operations of implanting and/or diffusing atoms with sufficiently different implantation and/or diffusion energies in order to create second discontinuous zones for the production of a substructure, notably a Bragg mirror.

More generally, to form a phononic crystal the invention may use any process involving either:
implanting atoms in a piezoelectric material so as to form either a new material (new phase) or said material with inclusions of smaller dimensions than the wavelength of propagation in said material; or carrying out a process causing chemical species to diffuse into the material, again resulting in the formation of a new material.

BRIEF DESCRIPTION OF THE DRAWINGS

The invention will be better understood and other advantages will become apparent on reading the following non-limiting description and by virtue of the appended figures in which.

DETAILED DESCRIPTION

Generally, the elastic structure of the present invention thus comprises within a layer of material of first Young's modulus and/or first density, at least one zone in which said Young's modulus and/or said density are/is modified by atomic implantation or by diffusion of chemical species so as to provide a layer having at least locally a second Young's modulus and/or a second density so as to be able to take advantage of mechanical properties, or even of electromechanical properties, that are tailored notably to applications employing acoustic propagation.

Thus, according to the invention, the fact that it is possible to modify elastic and therefore notably acoustic properties allows, for example, structures analogous to the multilayer structures conventionally encountered (acoustic waveguides, Bragg mirrors, etc.) to be formed simply, without however requiring the deposition of many layers.

The flexibility of implantation techniques (choice of the implanted species and the implantation energy) or diffusion techniques (choice of the source of the diffused species, temperature and length of the reaction) allows the original medium to be modified in different ways (hydrogen, helium, or carbon inclusions or formation of a new compound) at different depths and over different thicknesses. This not only allows the formation of periodic structures to be envisioned, but also the formation of highly heterogeneous structures.

Lastly, the implantation or the diffusion reaction can be carried out through a system of masks (made of resist or of another material that stops penetration of the implanted or diffused species), thereby allowing the aforementioned structures to be formed only inside predefined features. As a result it is possible to form three-dimensional structures by combining a number of masks and a number of different implantations and/or diffusions.

By combining conventional acoustic structures with locally modified zones, it is possible to design particularly advantageous structures, some of which will be described below by way of nonexhaustive example.

Figure 3:
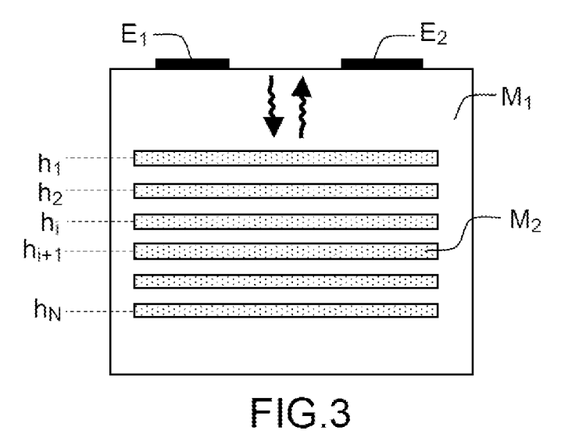
FIG. 3 illustrates a first variant of the invention, i.e. a bulk wave resonator comprising an implanted zone forming a Bragg mirror substructure.

Example of an SMR-Type Bulk Elastic Wave Resonator Structure:

Generally, an SMR-type bulk wave resonator comprises a thick layer of piezoelectric material, two upper electrodes and a Bragg mirror substructure. FIG. 3 illustrates an SMR-type resonator, according to the present invention, in which the Bragg mirror structure is formed by buried layers produced by atomic implantation. More precisely, within a material $M_1$ of first Young's modulus and/or of first density, layers of material $M_2$ having a second Young's modulus and/or a second density are produced by implantation, said layers being produced at respective depths $h_1, h_2, \ldots, h_N$, the distance between a depth $h_i$ and a depth $h_{i+1}$ being equal, for example, to a half wavelength in order to provide the array of stacked layers with a Bragg mirror substructure, two upper electrodes $E_1$ and $E_2$ being produced on the surface of the material of first Young's modulus.

According to the present invention, a Bragg mirror substructure may be produced relatively easily in a substrate of lithium niobate. In this particular case, implantation of hydrogen may cause a substitution reaction between the lithium atoms and the implanted atoms. Thus an $H_xLi_{(1-x)}NbO_3$ phase forms, the mechanical properties of which are substantially different from those of the original lithium niobate.

Figure 4:
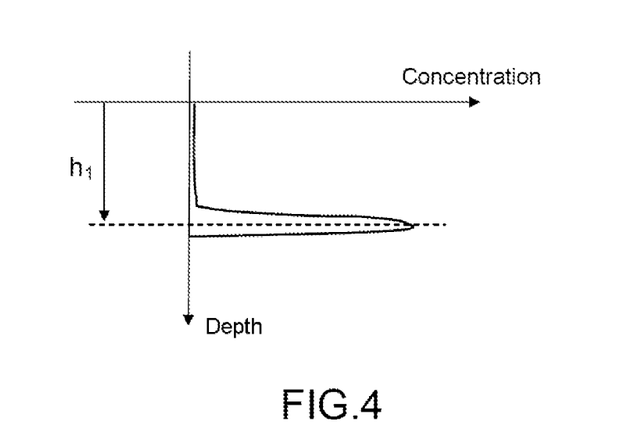
FIG. 4 illustrates the concentration profile of an implanted material as a function of depth.

FIG. 4 illustrates the concentration profile in an implanted material in an elastic structure according to the invention, and demonstrates that it is possible to define at a depth $h_1$, a layer of material of second Young's modulus with a sufficient implantation dose.

Thus a profile of acoustic properties (elasticity and density) similar (or opposite) to this concentration profile is obtained. By way of example, implantation of hydrogen in lithium niobate allows a thickness of 130 nm to be obtained for a dose of $8 \times 10^{16}$ atoms/cm$^2$, or a thickness of 202 nm to be obtained for a dose of $1.3 \times 10^{16}$ atoms/cm$^2$.

Figure 5:
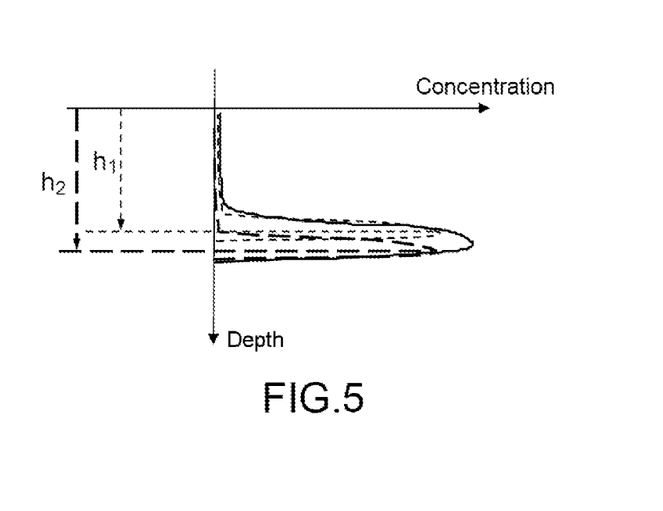
FIG. 5 illustrates a concentration profile with a concentration that has been flared out further by superposing individual profiles centered about different depths $h_1$ and $h_2$.

Thus, in order, optionally, to widen this profile, a number of implantations at different energies allow a more flared profile to be formed by superposing individual profiles centered about different depths $h_1$ and $h_2$, as shown in FIG. 5.

Figure 6:
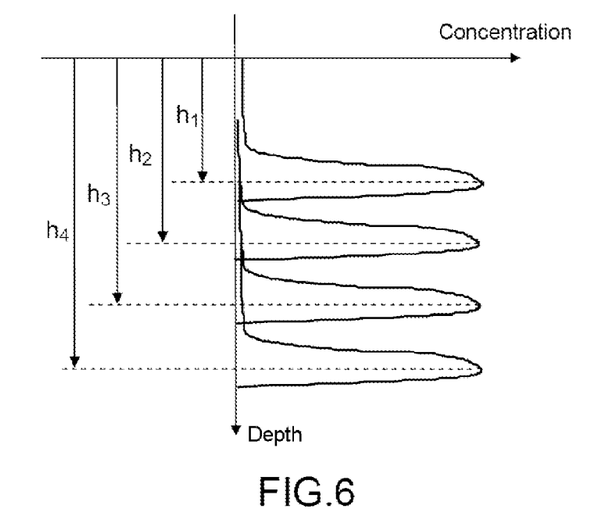
FIG. 6 illustrates a concentration profile that is periodic at depths $h_1$, $h_2$, $h_3$ and $h_4$ allowing a Bragg mirror substructure to be produced.

By repeating this operation a number of times at different energies, a concentration profile that is periodic at depths $h_1$, $h_2$, $h_3$ and $h_4$ is obtained, as shown in FIG. 6. This results in a periodic variation in acoustic properties and forms a Bragg mirror that reflects acoustic waves. Adjusting the widths of the profiles and their periodicity allows an acoustic mirror to be obtained operating at the desired frequency. As for the transmission of this mirror, it is set by the number of periods produced. It will be noted that for this application, large gradients in the acoustic properties, and therefore in the concentration of the implanted species, are not absolutely necessary since it is the periodicity of the structure that causes the wave reflection effect. A low acoustic contrast between the original material and the new phase formed may therefore be compensated for by applying many different implantations.

It will be noted that it is entirely possible to produce these implantations using a mask, thereby allowing the mirror to be defined only in line with the resonator and leaving the original material intact elsewhere.

Figure 7A:
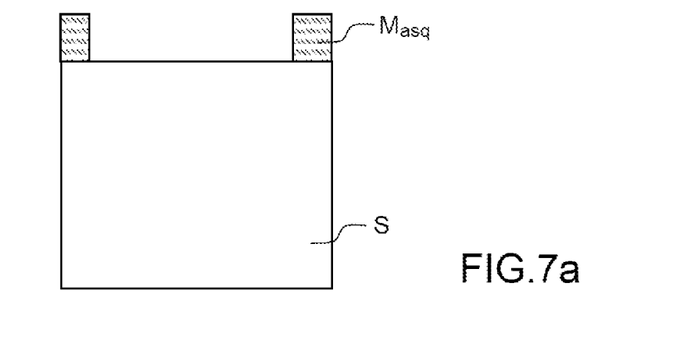
FIGS. 7a to 7d illustrate the various steps of a process for manufacturing the resonator illustrated in FIG. 3.
Figure 7B:
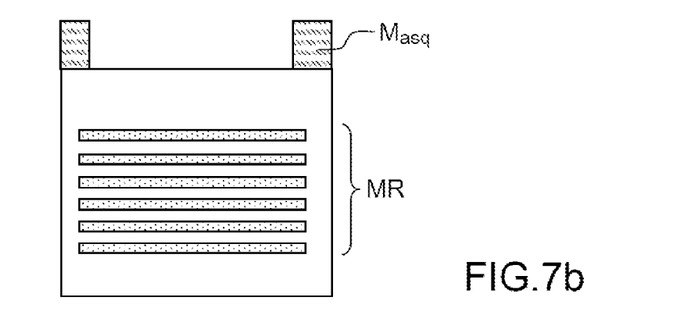
Figure 7C:
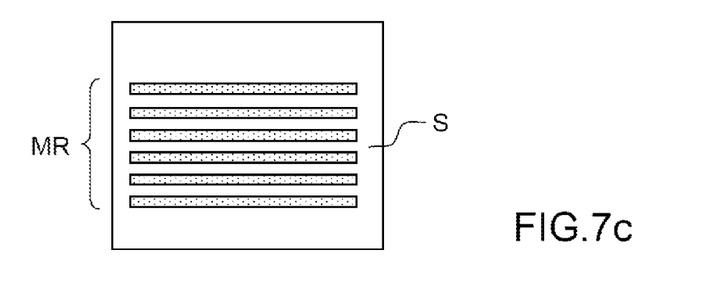
Figure 7D:
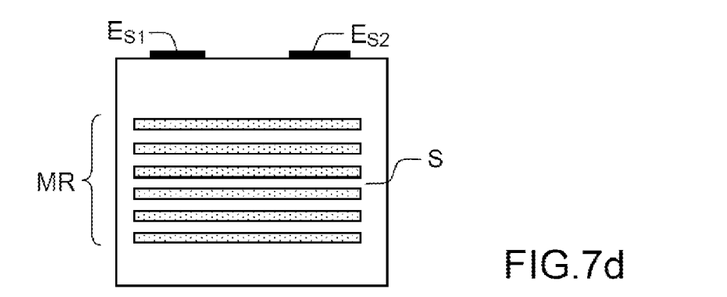

An exemplary process is described below with reference to FIGS. 7a to 7d:

starting with a substrate S of lithium niobate, cleaned beforehand, a photolithography operation is carried out in order to define an implantation mask $M_{asq}$ as illustrated in FIG. 7a;

as illustrated in FIG. 7b, hydrogen implantation operations are carried out in succession with decreasing energy in order to form a periodic implantation profile such as that illustrated in FIG. 6 and allowing a Bragg mirror substructure MR to be defined;

next, the resist mask $M_{asq}$ is removed as illustrated in FIG. 7c, and a homogenization annealing step is carried out; and lastly, as illustrated in FIG. 7d, a metal is deposited followed by another masking resist layer, a photolithography operation is performed, etching is carried out and the resist is removed, in order to define the upper electrodes $Es_1$ and $Es_2$, for example made of aluminum.

The electrodes may take the form of two mutually facing electrodes for an LFE, or of interdigitated combs for guided wave structures.

Figure 8A:
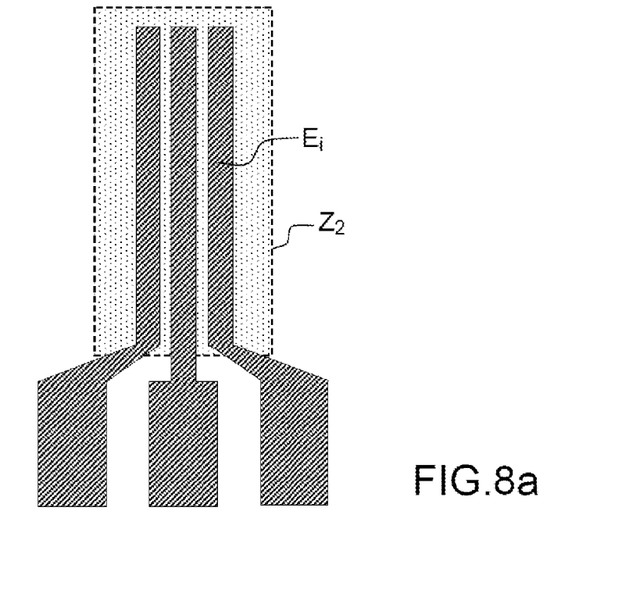
FIG. 8a illustrates a top view of an LFE (acronym for "lateral field excitation") resonator and FIG. 8b illustrates a top view of a guided wave resonator.
Figure 8B:
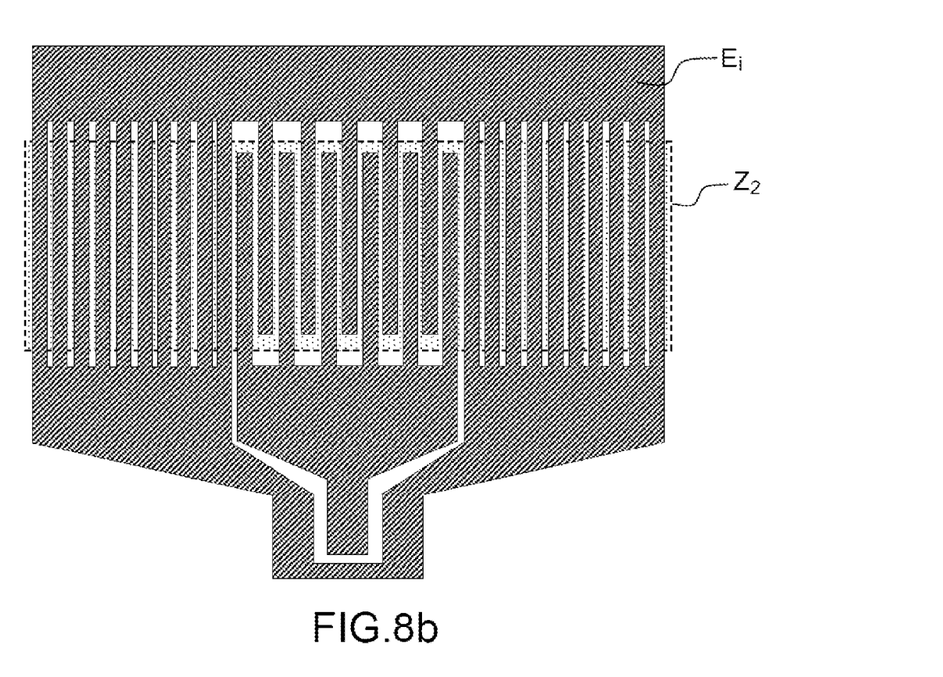

FIGS. 8a and 8b illustrate top views of an example of an LFE-type resonator with its upper electrodes Ei and its implantation zone $Z_2$ corresponding to the material of second Young's modulus and/or second density.

Generally, in an SMR-type resonator, once the mirror structure has been formed, a resonant acoustic cavity, localized between the surface of the substrate and the top of the mirror, is obtained naturally. In a Z-cut lithium niobate substrate, shear acoustic waves propagating vertically in this cavity are generated via a piezoelectric effect by application of a horizontal electric field. This field is obtained by forming, for example, two electrodes placed side-by-side, so as to form an LFE resonator excited via a lateral electric field.

Since implantation of hydrogen results in few defects beyond the implanted zone, the piezoelectricity of the original material is only very slightly affected. This type of resonator therefore has electromechanical coupling coefficients (a measure of the efficiency with which energy is converted from its electrical form to its mechanical form, and vice versa) of about 56% at frequencies of about 5 GHz.

By way of comparison, conventional (SMR) piezoelectric resonator technologies based on thin deposited films of aluminum nitride only allow piezoelectric coupling coefficients of about 6% to be obtained at the same frequencies. A component such as that described here therefore enables, for example, extremely wideband filters to be synthesized using relatively simple technology.

With an identical technology, if the bulk wave resonator electrodes are replaced by metallizations taking the form of interdigitated combs, as illustrated in FIG. 8b, it becomes possible to exploit laterally propagating waves that are also confined by an acoustic mirror formed from an alternation of different implantation profiles.

Example of a Three-Dimensional Phononic Crystal Structure

Phononic crystals are elastic analogs of photonic crystals. They are two- or three-dimensional arrangements of inclusions in a solid matrix. Periodicity effects then allow "bandgaps" to be formed in which the propagation of waves is greatly modified or even impossible. Two-dimensional arrangements can be produced by etching apertures in the propagation medium, and optionally filling them with a different material. At the present time, the formation of micron-sized or nanoscale three-dimensional networks using conventional microelectronic techniques remains difficult.

The present invention makes it possible, by combining techniques for implanting at different thicknesses, as was the case for the Bragg mirrors described above, and masks (for defining two-dimensional features), to form three-dimensional structures $Z_2$ within a material $Z_1$. For this application, the inclusions may be obtained by substitution or precipitation effects.

Such crystals may be used to form waveguide structures or acoustic lens structures, for example.

The technique for manufacturing these crystals uses the same process steps described above and illustrated in FIGS. 7a to 7c.

Such a crystal may for example be used in conjunction with resonators to provide lateral confinement of the waves generated in the resonant cavity, thereby allowing the quality factor of the final component to be improved in the case of filter-type application.

Specifically, in the prior art a category of interesting filters uses coupled resonators, these filters commonly being denoted CRFs, acronym for "coupled resonator filter".

More precisely, acoustic filters on quartz, called monolithic filters, make use of lateral coupling between resonators. In this case the resonators are placed side-by-side. Thickness shear (TS) waves, which are naturally evanescent beyond the resonators, are then excited and by varying the distance between resonators it is possible to vary the energy transmitted and thus modify the width of the pass band of the filter. The filter is then called a laterally coupled or monolithic filter.

Figure 9:
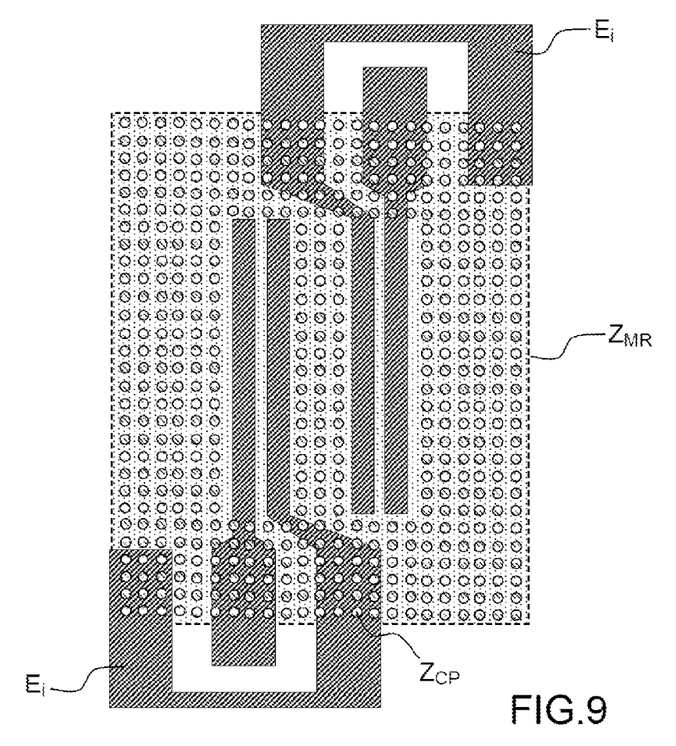
FIG. 9 illustrates a top view of an example of a laterally coupled acoustic filter coupled through a three-dimensional phononic crystal.

FIG. 9 thus illustrates a top view of an example of a filter with lateral acoustic coupling through a three-dimensional phononic crystal, showing the constituent implantation zones $Z_{MR}$ of the Bragg mirror substructure and the constituent implantation zones $Z_{CP}$ of the phononic crystal, with the upper electrodes Ei.

Figure 10:
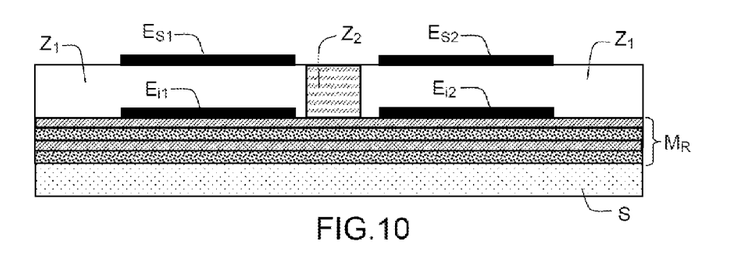
FIG. 10 illustrates a cross-sectional view of an example of a filter comprising laterally coupled resonators, the coupling of which is optimized by virtue of the presence of second implanted zones of second Young's modulus and/or of second density.

FIG. 10 therefore illustrates an example of a filter comprising laterally coupled resonators, the coupling of which is optimized by virtue of the presence of an implanted zone. More precisely, the coupled resonators are produced from a layer of piezoelectric material defining a first zone $Z_1$ of first Young's modulus, inserted between upper electrodes $E_{S1}$ and $E_{S2}$ and lower electrodes $E_{i1}$ and $E_{i2}$, the latter being produced on the surface of a substrate S. The coupling between resonators is optimized by virtue of the presence of a second zone $Z_2$, produced by atomic implantation, allowing the acoustic properties of said zone to be adjusted and a Bragg mirror substructure MR to be produced by atomic implantation.

An example of a manufacturing process allowing a laterally coupled SMR resonator with an integrated mirror structure to be produced will be described in greater detail below with reference to FIGS. 11a to 11e.

Figure 11A:
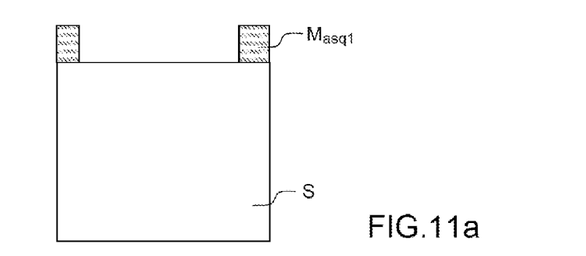
FIGS. 11a to 11e illustrate the steps of an example of a process allowing production of an example of a filter using LFE-type resonators and comprising three-dimensional phononic crystals and a Bragg mirror substructure, according to the invention.

In a first example, and as illustrated in FIG. 11a, an operation of cleaning a lithium niobate substrate S is carried out, followed by a photolithography operation defining a first mask $M_{asq1}$ intended to cover from the implanted zones of a Bragg mirror structure.

Figure 11B:
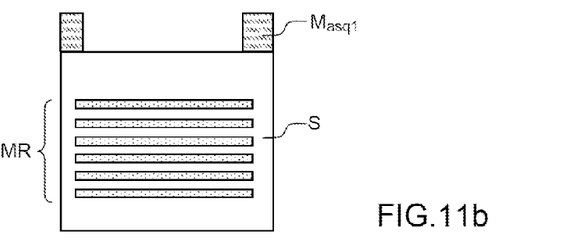

Next, as illustrated in FIG. 11b, hydrogen implantation operations are carried out in succession with decreasing energy in order to form a periodic implantation profile so as to obtain the Bragg mirror structure MR.

Figure 11C:
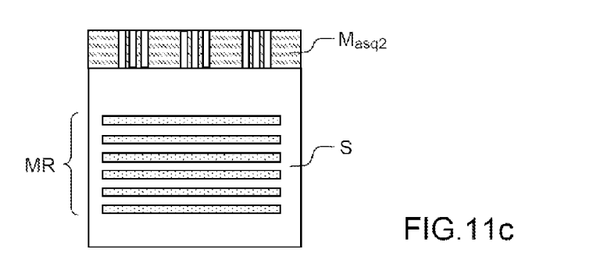

Next, as illustrated in FIG. 11c, the resist mask is removed, and then a new photolithography operation is carried out to define the second implantation mask $M_{asq2}$, in order to define zones of constituent features of the phononic crystal $Z_{CP}$.

Figure 11D:
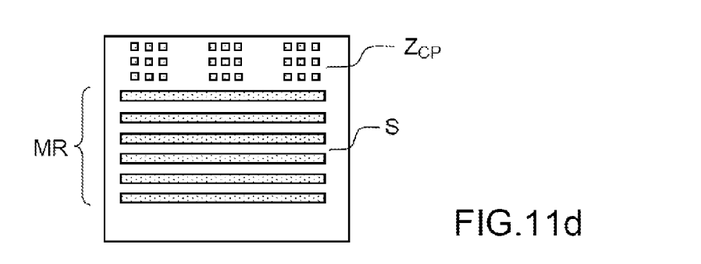

As illustrated in FIG. 11d, hydrogen implantations are then carried out in succession with decreasing energy in order to form a periodic implantation profile through the mask $M_{asq2}$, the latter then being removed and a homogenization anneal being carried out.

Figure 11E:
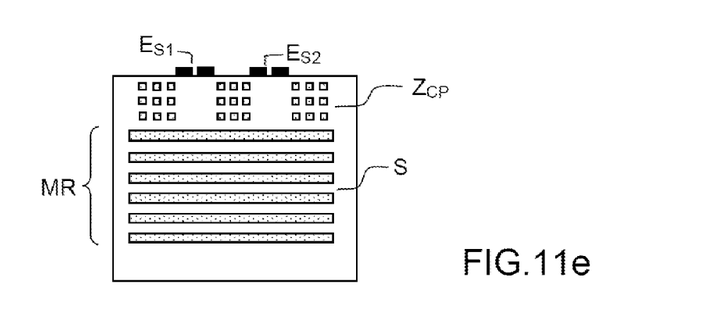

Lastly, it is then possible to deposit a metal layer, perform a photolithography operation and an etching operation, and then remove the resist in order to define the upper electrodes $Es_1$ and $Es_2$, which are for example made of aluminum, as illustrated in FIG. 11e.

Figure 12A:
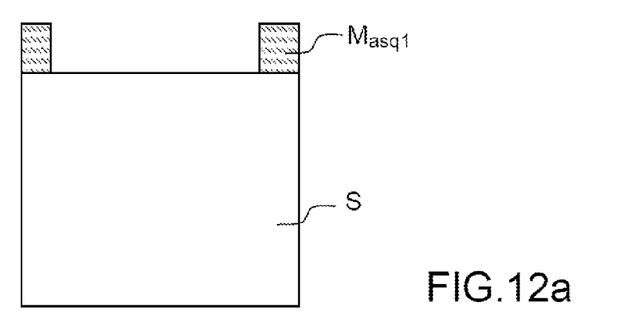
FIGS. 12a to 12e illustrate the steps of an example of a process allowing production of an example of a filter comprising an integrated Bragg mirror structure.

An equivalent structure may be obtained using only a two-dimensional phononic crystal located between the resonators that it is desired to couple acoustically. The two-dimensional phononic crystal structure is produced using the proton exchange process described above. As regards the production of the Bragg mirror and the electrodes, the production is identical to that of the preceding example. The technological steps allowing the manufacture of this type of structure are described, for example, in the following figures:

As illustrated in FIG. 12a, an operation of cleaning a piezoelectric lithium niobate substrate S is carried out, followed by a photolithography operation defining a first mask $M_{asq1}$ and implanted zones.

Figure 12B:
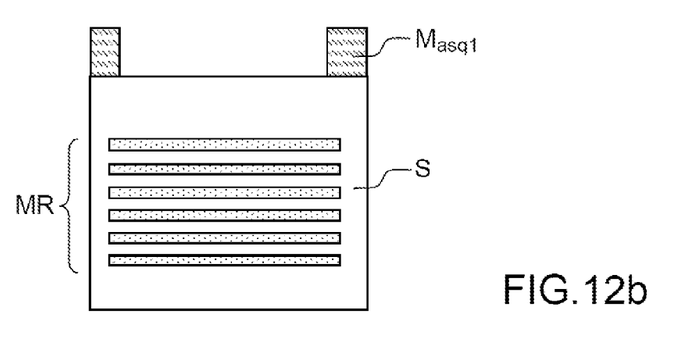

Next, hydrogen implantation operations are carried out in succession with decreasing energy in order to form a periodic implantation profile creating the Bragg mirror MR, as illustrated in FIG. 12b.

Figure 12C:
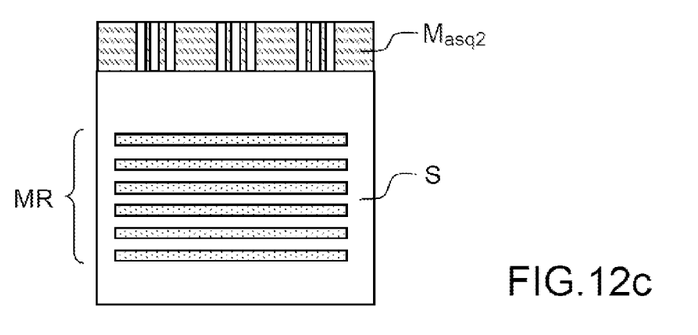

Next, removal of the resist mask by a new photolithography operation defines the second mask $M_{asq2}$ for the proton exchange, as illustrated in FIG. 12c.

Figure 12D:
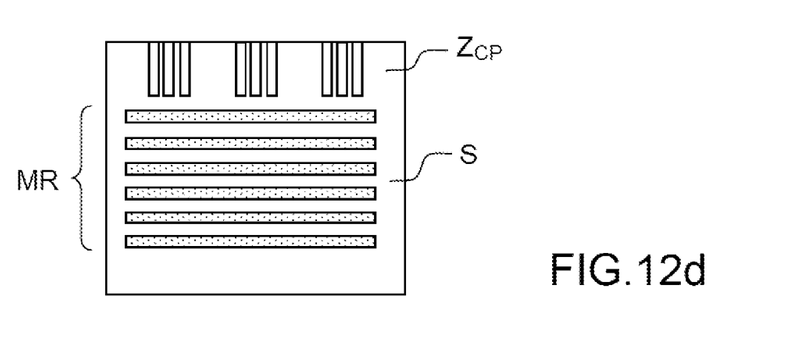

Next, the proton exchange is carried out via immersion in a bath of molten (temperature above 249° C.) benzoic acid ($C_6H_5COOH$). Then rinsing in alcohol is performed, followed by removal of the resist, allowing phononic crystal structures $Z_{CP}$ to be defined.

Figure 12E:
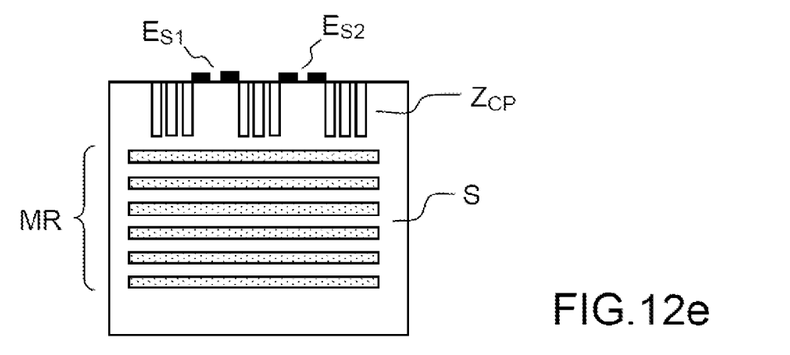

Finally, the following operations are carried out: deposition, photolithography, etching and resist removal, in order to define the upper electrodes $E_{s1}$ and $E_{s2}$, which are for example made of aluminum, as illustrated in FIG. 12e.

According to this variant, each resonator comprises a pair of upper electrodes $E_{s1}$ and $E_{s2}$ on the surface of the piezoelectric material, the electrodes of a given pair being very close to each other, typically separated by less than a few microns, the acoustic waves again propagating in the bulk of the piezoelectric material but being generated by an electric field parallel to the plane of said material.

Example of a Buried Waveguide Structure

Figure 13:
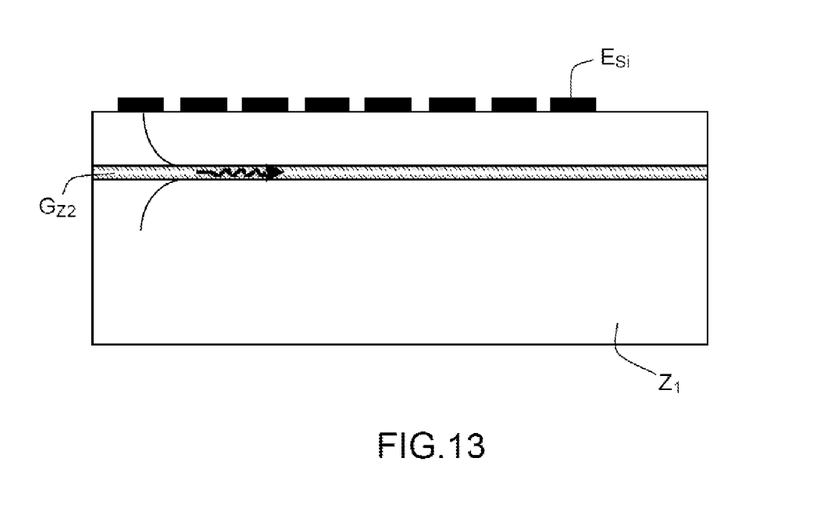
FIG. 13 illustrates an example of a component exploiting waves guided along an interface formed by implanting atoms in the propagation medium at a given depth, according to the invention.

A third possible application of the invention consists in forming a component exploiting waves guided along an interface. Such an interface is formed by implanting atoms into the propagation medium at a given depth, thus allowing a guide $G_{z2}$ to be defined comprising said zone of second Young's modulus within a material corresponding to the zone $Z_1$ of first Young's modulus and/or of first density. If a sufficient number of these atoms are implanted, they precipitate and form localized nano gas inclusions in a given line. Locally, along a thin line, an equivalent medium then forms in which propagation speeds are lower than those in the surrounding medium. Waves may then propagate along this interface, while remaining guided by it (because they are evanescent in the original material), as shown in FIG. 13, by virtue of the presence of surface electrodes $E_{Si}$.

The component itself is therefore produced using the following process, comprising the following steps:

implantation of atoms along the desired guide line;
precipitation anneal; and
deposition and structuring of electrodes (which are for example made of aluminum) taking the form of interdigitated combs on the surface of the substrate.

It will be noted that it is also possible to produce this interface with an implantation intended to cause substitution.

Figure 14A:
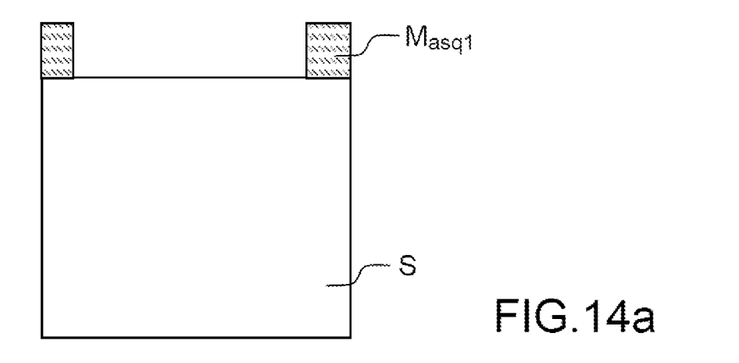
FIGS. 14a to 14c illustrate the steps of a process allowing the production of the implanted waveguide structure shown in FIG. 13.
Figure 14B:
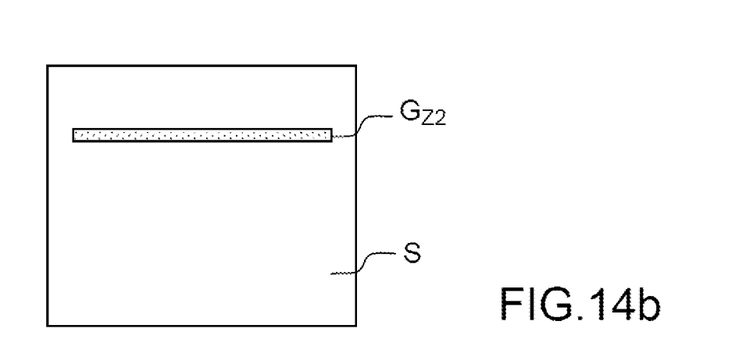
Figure 14C:
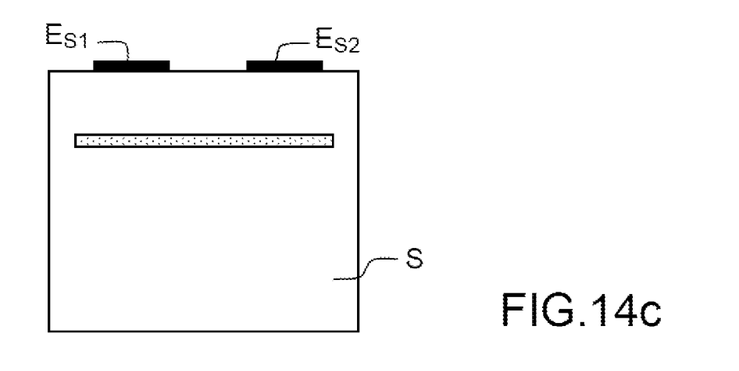

FIGS. 14a to 14c illustrate, in this respect, an example of a process allowing such a buried waveguide to be obtained.

As illustrated in FIG. 14a, a lithium niobate substrate S is cleaned, then a photolithography operation is carried out in order to define an implantation mask $M_{asq}$.

Next, as illustrated in FIG. 14b, an operation for implanting helium at the depth at which it is desired to produce the guiding interface $G_{Z2}$ is carried out.

The resist mask is then removed and the precipitation operation carried out.

Lastly, as illustrated in FIG. 14c, a metal layer is deposited and a photolithography operation, etching and removal of the resist are carried out in order to define the upper electrodes $Es_1$ and $Es_2$, which are, for example, made of aluminum.

The invention claimed is:

1. An acoustic structure, comprising:
a layer of piezoelectric material having a first Young's modulus called an intrinsic modulus and a first density called an intrinsic density,
wherein the layer of piezoelectric material comprises:
at least one first zone ($Z_1$) having said first Young's modulus and said first density; and
at least one second zone ($Z_2$) buried in the volume of said layer of piezoelectric material and having a second Young's modulus and/or a second density, wherein the second zone ($Z_2$) comprises inclusions of which a size is smaller than an acoustic wavelength at a frequency lower than a few tens of gigahertz.

2. The acoustic structure as claimed in claim 1, wherein said structure comprises electrodes on the surface of said layer, so as to generate acoustic waves.

3. The acoustic structure as claimed in claim 1, wherein the layer of piezoelectric material further comprises a buried sublayer of inclusions and/or of a new phase so as to create a guide for elastic waves.

4. The acoustic structure as claimed in claim 2, further comprising at least one first upper electrode and one second upper electrode, the second zone comprising periodic sublayers of inclusions and/or new phases defining a buried Bragg mirror structure, so as to define a bulk SMR-type wave resonator.

5. The acoustic structure as claimed in claim 1, wherein the second zone comprises periodic structures of inclusions and/or new phases so as to define a phononic crystal structure.

6. The acoustic structure as claimed in claim 1, further comprising upper electrodes defining coupled resonator structures separated by a second zone of second Young's modulus and/or of second density so as to optimize the coupling between said resonators.

7. The acoustic structure as claimed in claim 6, further comprising third zones of third Young's modulus and/or of third density comprising inclusions and/or a new phase on the periphery of the two coupled resonators so as to decrease propagation of the lateral acoustic waves in the piezoelectric material in said third zones more greatly than in said second zones, the density of inclusions and/or their nature and/or the phase in the third zones being different to those of the second zones.

8. The acoustic structure as claimed in claim 1, wherein the acoustic structure is made by a process comprising the following steps:
producing a mask so as to isolate said second zone from said first zone; and
implanting and/or diffusing atoms so as to define said second zone through the mask by creating a new phase and/or inclusions.

9. The acoustic structure as claimed in claim 8, wherein the process further comprises at least one step of producing electrodes, said structure being an acoustic wave resonator.

10. The acoustic structure as claimed in claim 8, wherein the process further comprises an annealing step after the step of implanting and/or diffusing atoms.

11. The acoustic structure as claimed in claim 8, wherein the process further comprises successive operations of implanting and/or diffusing atoms at similar energies so as to create a second continuous implantation and/or diffusion zone.

12. The acoustic structure as claimed in claim 9, wherein the process further comprises a step of removing said mask.

13. The acoustic structure as claimed in claim 1, wherein the size of inclusions is in a range of a few tens of nanometers and the acoustic wavelength is in a range of a few hundred nanometers.

14. An acoustic structure, comprising:
a layer of piezoelectric material having a first Young's modulus called an intrinsic modulus and a first density called an intrinsic density,
wherein the layer of piezoelectric material comprises:
at least one first zone ($Z_1$) having said first Young's modulus and said first density; and
at least one second zone ($Z_2$) buried in the volume of said layer of piezoelectric material and having a second Young's modulus and/or a second density, wherein the second zone ($Z_2$) comprises a new phase with substitution of at least one atom of the piezoelectric material.

15. The acoustic structure as claimed in claim 14, wherein the material is lithium niobate $LiNbO_3$, and the second zone comprises a new phase comprising a material of the type $H_xLi_{(1-x)}NbO_3$ having said second Young's modulus.

16. The acoustic structure as claimed in claim 14, wherein said structure comprises electrodes on the surface of said layer, so as to generate acoustic waves.

17. The acoustic structure as claimed in claim 14, wherein the layer of piezoelectric material further comprises a buried sublayer of inclusions and/or of a new phase so as to create a guide for elastic waves.

18. The acoustic structure as claimed in claim 16, further comprising at least one first upper electrode and one second upper electrode, the second zone comprising periodic sublayers of inclusions and/or new phases defining a buried Bragg mirror structure, so as to define a bulk SMR-type wave resonator.

19. The acoustic structure as claimed in claim 14, wherein the second zone comprises periodic structures of inclusions and/or new phases so as to define a phononic crystal structure.

20. The acoustic structure as claimed in claim 14, further comprising upper electrodes defining coupled resonator structures separated by a second zone of second Young's modulus and/or of second density so as to optimize the coupling between said resonators.

21. The acoustic structure as claimed in claim 20, further comprising third zones of third Young's modulus and/or of third density comprising inclusions and/or a new phase on the periphery of the two coupled resonators so as to decrease propagation of the lateral acoustic waves in the piezoelectric material in said third zones more greatly than in said second zones, the density of inclusions and/or their nature and/or the phase in the third zones being different to those of the second zones.

* * * * *

UNITED STATES PATENT AND TRADEMARK OFFICE
CERTIFICATE OF CORRECTION

| | |
|---|---|
| PATENT NO. | : 9,209,779 B2 |
| APPLICATION NO. | : 13/879562 |
| DATED | : December 8, 2015 |
| INVENTOR(S) | : Reinhardt |

It is certified that error appears in the above-identified patent and that said Letters Patent is hereby corrected as shown below:

On the title page item [75], replace "Ville (FR)" with --Saint Martin D'Heres (FR)--.

Signed and Sealed this
Twelfth Day of April, 2016

Michelle K. Lee
*Director of the United States Patent and Trademark Office*